Figure 1:
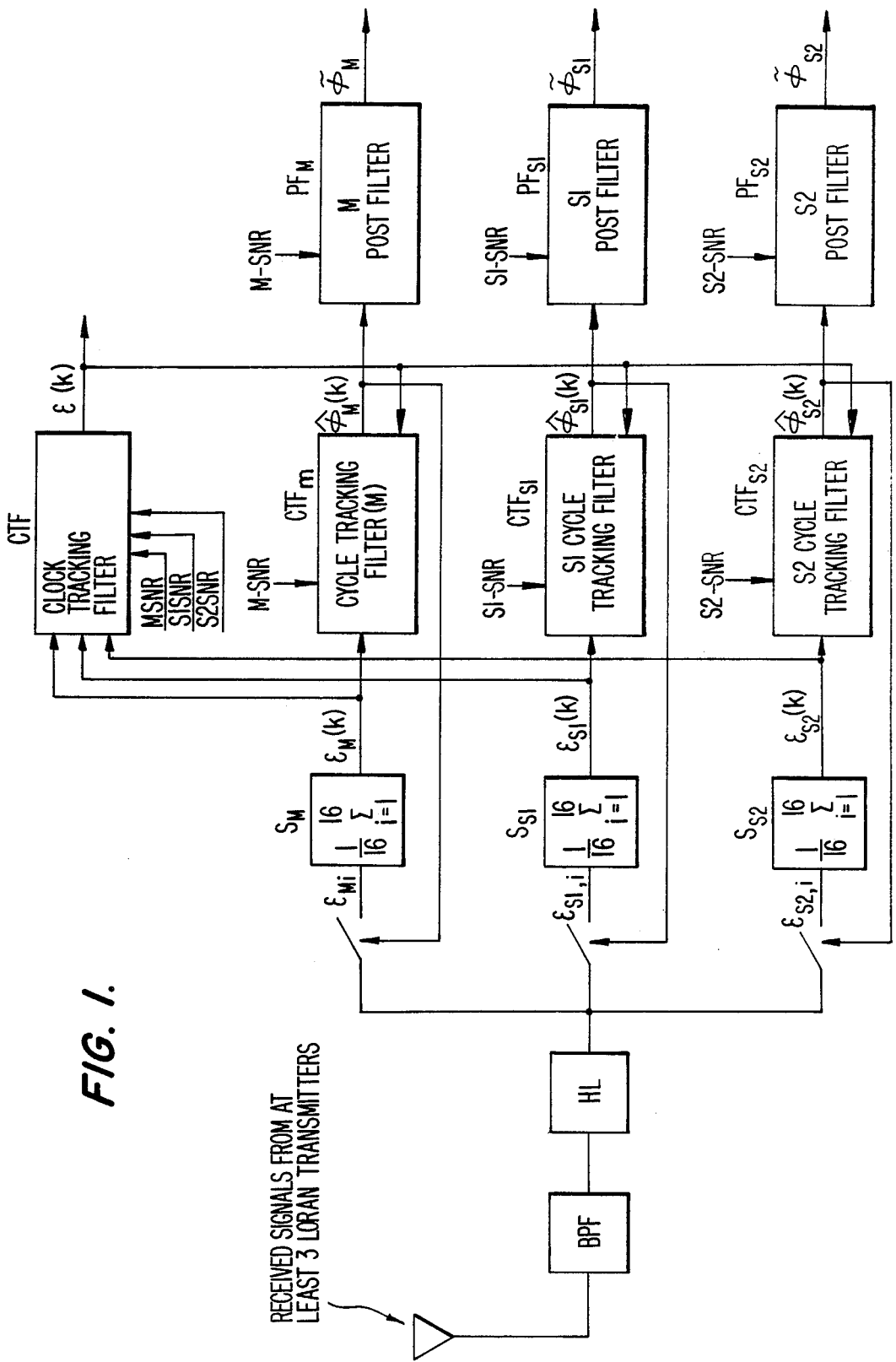

United States Patent [19]

Enge et al.

[11] Patent Number: 4,743,912

[45] Date of Patent: May 10, 1988

[54] METHOD OF AND APPARATUS FOR REDUCING CYCLE SLIPPAGE ERRORS IN LORAN-C AND SIMILAR RADIO-FREQUENCY SIGNAL RECEPTION, PARTICULARLY IN VEHICLES UNDERGOING ACCELERATION

[75] Inventors: Pere Enge, Bedford; Robert Goddard, Stoneham, both of Mass.

[73] Assignee: Megapulse Inc., Bedford, Mass.

[21] Appl. No.: 747,986

[22] Filed: Jun. 24, 1985

[51] Int. Cl.$^4$ ............................................. G01S 1/24
[52] U.S. Cl. .................................. 342/390; 342/389
[58] Field of Search ................. 343/389, 390; 364/452

[56] References Cited

U.S. PATENT DOCUMENTS

| | | | |
|---|---|---|---|
| 3,044,064 | 7/1962 | Durbin | 343/389 |
| 3,685,052 | 8/1972 | Van Etten | 343/389 |
| 3,736,590 | 5/1973 | Lipsey et al. | 343/389 |
| 3,774,210 | 11/1973 | Mollod et al. | 343/389 |
| 3,786,334 | 1/1974 | Johannessen | 321/45 |
| 3,921,076 | 11/1975 | Currie | 325/321 |
| 4,151,528 | 4/1979 | Johannessen | 343/103 |
| 4,224,623 | 9/1980 | Mercer et al. | 343/390 |
| 4,392,138 | 7/1983 | Jasper et al. | 343/389 |
| 4,416,017 | 11/1983 | Jasper et al. | 364/452 |
| 4,445,223 | 4/1984 | Jasper et al. | 343/389 X |
| 4,482,896 | 11/1984 | Menick | 343/390 |
| 4,595,927 | 6/1986 | Menick | 343/389 X |

OTHER PUBLICATIONS

T. R. Benedict and G. W. Bordner, "Synthesis of an Optimal Set of Radar Track–While–Scan Smoothing Equations", Jul. 1962, pp. 27–32.

Donald A. Feldman, "An Atmospheric Noise Model with Application to Low Frequency Navigation Systems", Jun. 1972, pp. 1–205.

*Primary Examiner*—Theodore M. Blum
*Assistant Examiner*—Mack Hellner
*Attorney, Agent, or Firm*—Rines and Rines, Shapiro and Shapiro

[57] ABSTRACT

Method and apparatus of obviating cycle-locking slippage errors in reception of Loran-C and similar radio-frequency signals covered by receiver location acceleration effects and other distortion effects simulating the same, that comprises, receiving the radio-frequency signals and producing data by sampling and tracking the cycles of the signal with a time-constant filter sufficiently fast to accommodate for the largest acceleration to be experienced by the receiver location to avoid cycle slippage in locating a predetermined cycle zero crossing, and independently post-filtering sufficiently slowly to smooth the data and without interaction with said sampling.

12 Claims, 5 Drawing Sheets

METHOD OF AND APPARATUS FOR REDUCING CYCLE SLIPPAGE ERRORS IN LORAN-C AND SIMILAR RADIO-FREQUENCY SIGNAL RECEPTION, PARTICULARLY IN VEHICLES UNDERGOING ACCELERATION

The present invention relates to Loran-C and similar radio-frequency systems that provide transmitted navigation, location or related radio-frequency tracking pulses or the like, and in which vehicles carrying the receiving equipment are subject to acceleration and similar phenomena that can introduce cycle-locking slippage errors in the reception and processing operation.

In the illustration of Loran-C tracking, receiver locking on the sixth zero-crossing or onset of the third distinct cycle of the Loran pulse has been customary, as described, for example, in U.S. Pat. No. 3,921,076 and the references therein referred to, which are characteristic of suitable receivers useful in accordance with the invention; and suitable transmitters of the navigation pulses are described, for example, in U.S. Pat. Nos. 3,786,334 and 4,151,528 of the common assignee of the present invention. As is well-known, Loran-C operates at a frequency of 100 kHz with the master station (M) transmitting groups of 8 pulses with a predetermined group repetition interval (GRI). Two or more secondary stations also transmit groups of 8 pulses using the same GRI. The secondary transmissions are synchronous with the master transmissions and all stations have unique time slots. At the vehicular or other mobile receiving location, the receiver tracks the master and secondary station signals and determines the time differences between the reception of the master signal and the corresponding transmissions from each of the secondary stations. The time differences between the receipt of the master and each of the secondary stations define hyperbolic lines or paths of position tracking and the intersection of two of more such lines determines the receiver location.

In the first-named receiver patent, above, operation of phase locked loops for proper third cycle locking are described.

There are occasions, however, where acceleration of the vehicle carrying the receivers for monitoring and navigating with the transmitted Loran-C signals may suffer cycle-section locking errors, because the receiver is accelerating faster than the phase-lock loop can keep up with, or accommodate. As an example, phase-lock loops of this character can keep up with acceleration of the vehicle carrying the receiver of, say, 1/10 g. However, for faster vehicle accelerations of the order of ½ g or faster, the tracking loop may not be able to respond fast enough, and the sampling circuit may get behind (or ahead) and cause slippage to the second (or the fourth-)cycle for locking—a $\pm 10/\mu s$ error for Loran-C frequencies. In some cases, this error is temporary, though perhaps slow in correction; and in other cases, there may be no correction. The troublesome acceleration may be due to actual receiver movement or where the Loran signal paths or plot lines developed between master and secondary stations are distorted by the fields of power lines or large effective reflecting or otherwise distorting objects that cause effects that resemble the faster crossing of Loran signal plot lines.

An object of the present invention, accordingly, is to provide a new and improved method of and apparatus for receiving Loran-C and similar radio frequency signals in which possible cycle locking errors caused by receiver vehicle or location acceleration, or other field distortion effects that cause similar signal phenomena, are greatly reduced, if not eliminated.

A further object is to provide a novel signal-locking apparatus and method of more general utility as well.

Other and further objects will be explained hereinafter and are more particularly delineated in the appended claims.

In summary, from one of its important view points, the invention embraces a method of obviating cycle-locking slippage errors in reception of Loran-C and similar radio-frequency signals caused by receiver location acceleration effects and other distortion effects simulating the same. The invention comprises receiving the radio-frequency signals and producing data therefrom by sampling and tracking the cycles of the signal with a time-constant filter sufficiently fast to accommodate for the largest acceleration to be experienced by the receiver location to avoid cycle slippage in locating a predetermined cycle zero crossing, and independently post-filtering sufficiently slowly to smooth the data and without interaction with said sampling. Additionally, the invention comprises estimating receiver clock errors by filtering signals from all stations and weighting such that the quality of the clock estimate is maintained by the highest quality signals. Preferred embodiment and best mode details are later presented.

The invention will now be described with reference to tha accompanying drawings

Figure 2:
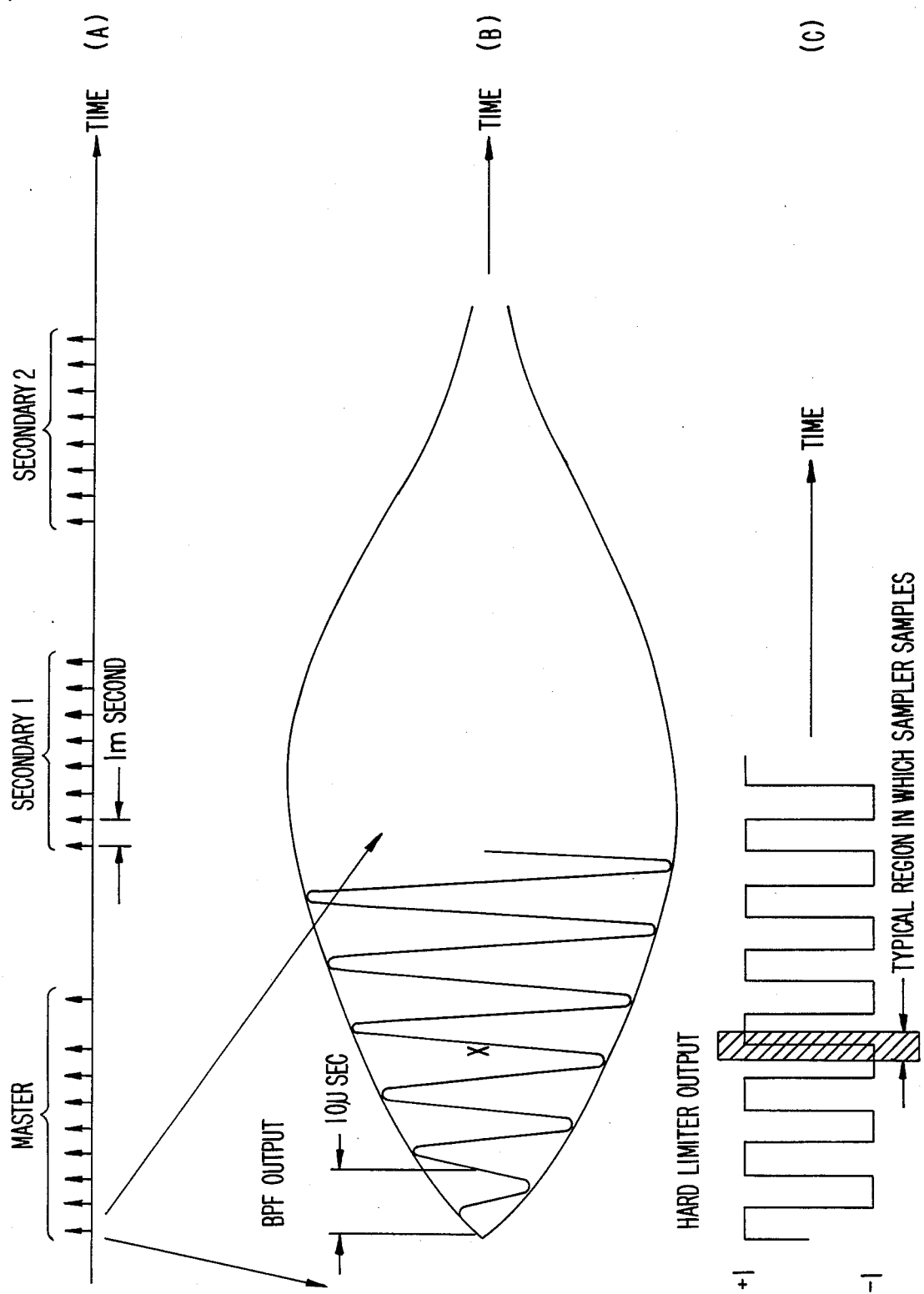
Figure 3:
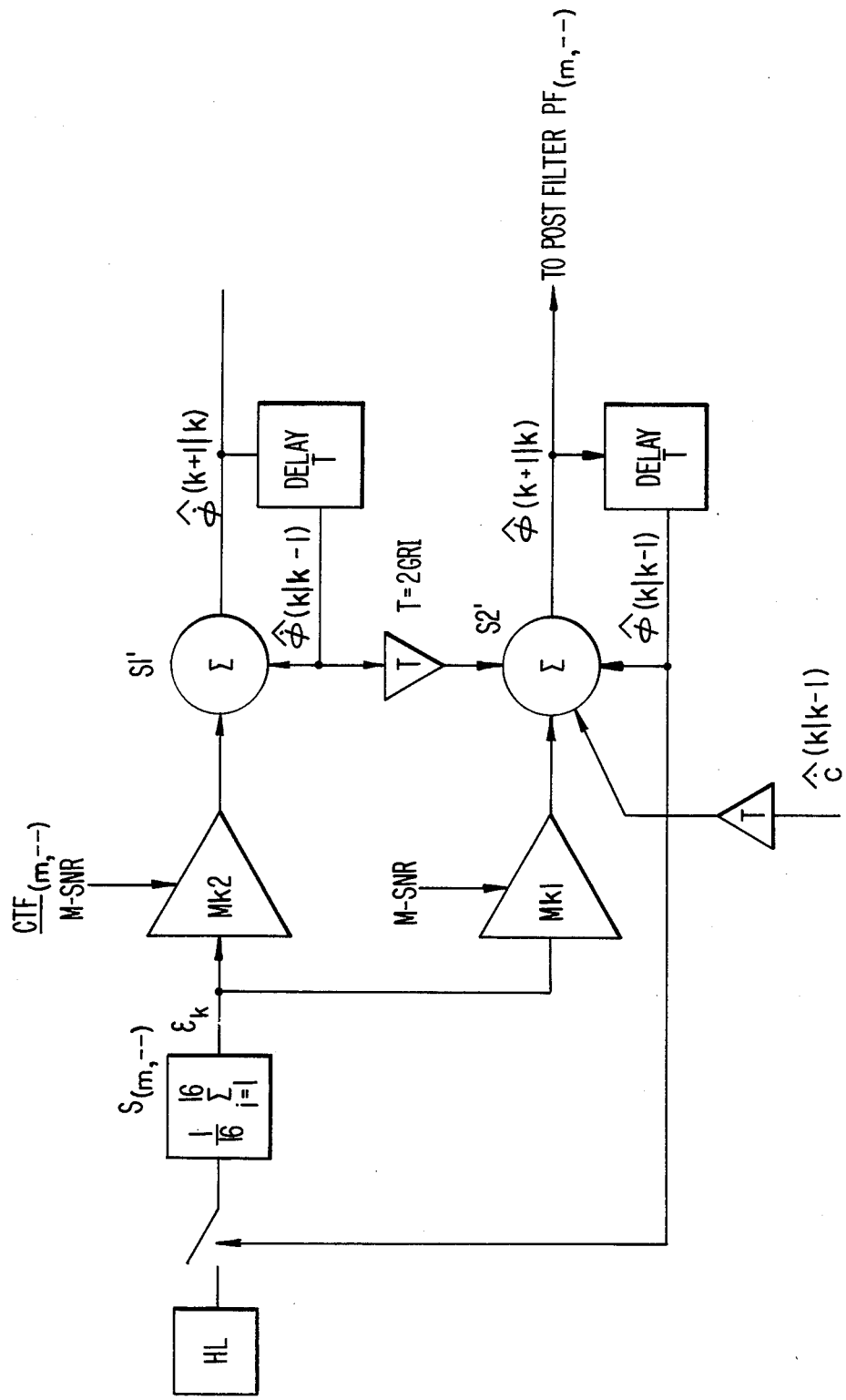
Figure 4:
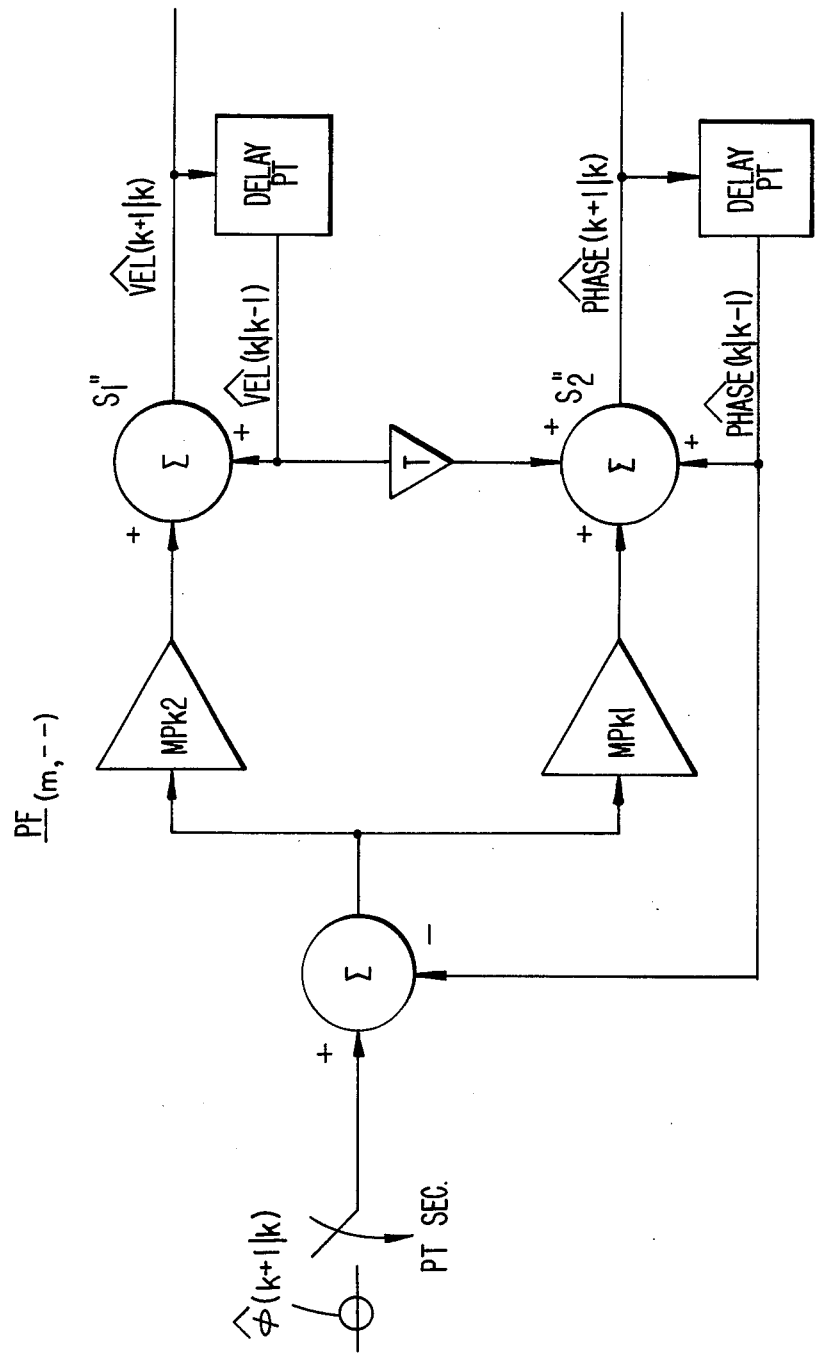
Figure 5:
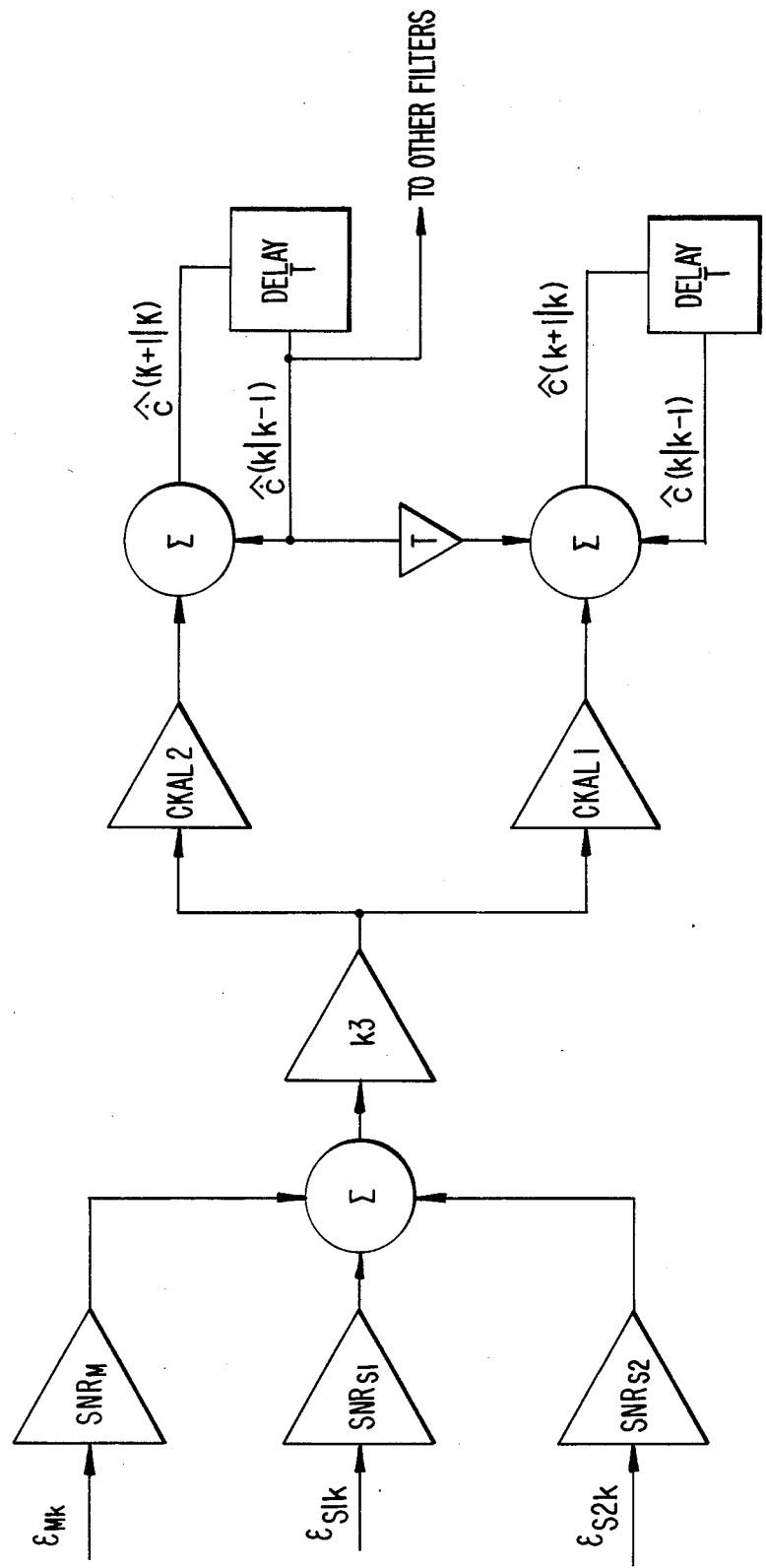

FIG. 1. of which is a block diagram of a preferred receiving apparatus for practicing the method of the invention;

FIG. 2 presents signal envelope and wave-forms describing the operation of the system of FIG. 1;

FIG. 3 is a block diagram of a preferred cycle tracking filter for use in the system of FIG. 1; and FIGS. 4 and 5 are similar diagrams of preferred post filter and clock tracking filters for use in FIG. 1.

Underlying the invention is the philosophy of employing a fast time-constant (order of a second or so) high gain phase-lock sampling tracking filter, fast enough in response to avoid cycle slippage for any possible receiver vehicle or location accelerations (though noisy) and then a post filter that smooths the desired data without affecting the sampling gate operation of the fast time-constant phase-lock sampling cycle tracking filter. Additionally, the philosophy of estimating the receiver clock error with the highest quality signal available is fundamental.

The specific techniques involved in the phase lock loop (PLL) operation are:

1. A "cascaded" PLL containing a cycle-tracking filter (CTF) and a post filter (PF). The CTF is designed to minimize the probability of unlock and the PF is designed to smooth the output phase estimate.

2. A separate clock filter that takes as input the error signals provided by all the stations in the chain. The importance of the different error signals is weighted according to the signal-to-noise ratio (SNR) of the corresponding signal so that the quality of the clock velocity estimate is maintained by the best SNR available.

In the embodiment of FIG. 1, it is assumed that signals from three stations are being received: Master (M), Secondary 1 (S1), and Secondary 2 (S2). As shown, the received signals are processed by a band pass filter (BPF) that reduces out-of-band interference and typically has a bandwidth between 12 kHz ad 24 kHz. After the BPF, a hard limiter HL is interposed because such zero memory nonlinearities improve receiver performance in the "impulsive" noise, characteristic of the LF band of Loran-C. The received waveforms associated with the Loran-C pulse are shown in FIG. 2, as later discussed.

The output of the hard limiter HL is sampled at times close to the sixth zero crossing of each received Loran-C pulse X, FIG. 2B, with the ninth master pulse (FIG. 2A) ignored and each group repetition interval for the Master, Secondary 1 and Secondary 2 having eight samples, taking the value $+1$ or $-1$. If the average is positive, the sample is late; if negative, the sample is early. The samples are taken at a time equal to the receiver's best estimate of the pulse's sixth zero crossing, as indicated in FIG. 2C. Thus in FIG. 1, the hard limited waveform is sampled to produce $\epsilon_{mi}$, $\epsilon_{s1,i}$ and $\epsilon_{s2,i}$. These samples are input to the summers ($S_m$, $S_{s1}$, and $S_{s2}$) which sum over a time interval of 2 GRIs or roughly 100 msec to 200 msec. This summation reduces the computational load of the microprocessor and does not appreciably degrade the performance of the PLL. An interval of 2 GRIs is chosen for two reasons: first, no appreciable phase bias error is introduced by phase velocity over such an interval; and secondly, the Loran-C phase code usually has period equal to 2 GRIs, which means that full skywave rejection requires at least 2 GRIs of summation. The outputs of the summers, ($\epsilon_m$, $\epsilon_{s1}$ and $\epsilon_{s2}$) are error signals which will be used to upgrade the receiver's estimate of the pulse's phase (e.g. in Kalman Filter terminology, they are "innovation" sequences). The innovation sequences are input to the respective cycle tracking filters CTF(M), CTF(S1) and CTF(S2) and the clock tracking filter CTF. These cycle tracking filters generate phase estimates for each of the received Loran signals, and have the main responsibility to minimize the probability of unlock or cycle slippage. In other words, they are designed so that the probability that their phase estimate differs from the actual phase by more than $\pi/2$ is very small.

In the embodiment of FIG. 1, the cycle tracking filters (CTF(M), CTF(S1) and CTF (S2)) take estimates of signal-to-noise ratio (SNR) as input (shown at M-SNR, S1-SNR and S2-SNR, respectively) which allows them to adapt to changing environment. They also take an estimate of the clock induced phase velocity provided by the clock tracking filter (CTF), shown at E(K). The clock tracking filter, in turn, receives the SNR estimates from all the received signals (M-SNR, S1-SNR, S2-SNR) and the outputs from the summers $S_m$, $S_{s1}$ and $S_{s2}$.

In accordance with the invention, the clock tracking filter (CTF) generates estimates of the portion of the phase velocity, which is introduced by the frequency off-set of the receiver clock. This clock velocity component is constant for all signals, and consequently all three (or more) innovation sequences contain relevant information. It is for this reason that all three innovation sequences are fed to the clock filter, as just described, and the clock filter is adjusted to pay greatest attention to the sequence from the signal with the greatest SNR.

The low time constant (quick response) cycle tracking filters (CTF(M), CTF(S1) and CTF(S2)), as before stated, are followed by post filters, respectively at PF(M), PF(S1) and PF(S2). The post filters take the phase estimates from the cycle tracking filters and SNR estimates as input. They generate "smoothed" estimates of signal phase ($\phi_m$, $\phi_{s1}$ and $\phi_{s2}$ as output and their time constants are only limited by the expected velocity of the vehicle and can be customized to the situation at hand.

It is now in order to describe how the cycle tracking filters may be constructed to achieve the above-described functions. As previously stated, the cycle tracking filter is designed to minimize probability of unlock. This is achieved by using the filter of FIG. 3. As shown, the filter is a traditional 2nd order phase lock loop. As such it can be derived by Kalman Filter theory for the optimal estimation of a 2nd order process, or it can be recognized as a traditional alpha-beta structure; for example, see "Synthesis of an Optimal Set of Radar Track - While-Scan Smoothing Equations" by T. R. Benedict and G. W. Bordner, IRE Transactions on Automatic Control, July 1962 pp 27-32. Additionally, this structure when combined with the hard limiter (see FIG. 1) is widely recognized as a near optimal phase estimater in atmospheric noise (see "An Atmospheric Noise Model with Applications to Low Frequency Navigation Systems" by D. A. Feldman Ph.D. dissertation, MIT, June 1972. The invention is distinguished by the choice of the constants MK1 and MK2 and the input of the clock phase velocity estimate ($\hat{e}(k/k-1)$ in FIG. 3 or E(k) in FIG. 1) from the independent clock tracking filter. The constants MK1 and MK2 have been chosen to minimize cycle shippage and have been determined through extensive computer simulation and laboratory experiments. As shown in FIG. 3, innovations $\epsilon_k$ are multiplied by MK1 and MK2 and are applied to the summers S1' and S2'. The outputs of summers S1' and S2' are estimates of the signal phase and phase velocity, respectively. Note that the current estimates take as input the immediate past estimate, and that the current phase estimate ($\phi(k+1/k)$) depends on the signal phase velocity estimate and the clock velocity estimate. The current phase estimate is output for the appropriate post filter (PF) for further smoothing.

As before stated, the function of the post filter (PF) is to complement the cycle tracking filter. In other words, it smooths the phase estimate which the cycle tracking filter generates. While in FIG. 1 there is illustrated one post filter per station, this could be changed so that there is one post filter per time difference.

The post filter is shown in FIG. 4. As in the case of the cycle tracking filter, it takes SNR estimates as input. However, it does not take clock phase velocity as input, because the clock contribution to phase velocity is removed in the cycle tracking filter. The post filter takes input at a sampling period equal roughly to one time constant of the cycle tracking filter. The structure of the post filters is the same as that of the cycle tracking filters (i.e. 2nd order Kalman Filter or alpha-beta filter). The output of the cycle tracking filter is compared to the post filter's current estimate of the signal phase and the difference is multiplied by MPK1 and MPK2. These Kalman gains (which are roughly equivalent to alpha and beta) control the time constant of the post filter and can be customized to the application on hand. The multiplied error signals are fed to the summers $S_1''$ and $S_2''$ which output phase velocity and phase estimates. Both take post estimates as input and the phase summer takes the phase velocity estimate as an additional term.

Turning, lastly, to the clock tracking filter (CTF), it estimates the phase velocity due to the receiver clock frequency offset, as previously described. This clock component of the phase velocity affects the signals from all stations in the same manner and is generally large. Consequently, the filter observes the signals from all stations and weights these observations by the corresponding SNR. In this way, the quality of the velocity estimate depends on the strongest observed signal for subsequent processing. In the form shown in FIG. 5, the clock filter is also of the 2nd order filter type. The elements from each station's innovation sequence is multiplied by the corresponding signal to noise ratios and then summed. The resultant sum is then normalized by the gain K3 and fed to a 2nd order filter, as before discussed. The filter develops estimates of clock phase and clock phase velocity and the latter is provided to the rest of the receiver, as per FIG. 1.

The filter time constant of the clock filter should be small (roughly 5 seconds) when the receiver first acquires signals; but it should be increased to approximately 5 minutes after some initial warm up period.

Further modifications will occur to those skilled in this art, and such are considered to fall within the spirit and scope of the invention as defined in the appended claims.

What is claimed is:

1. A method of obviating cycle-locking slippage errors in reception of Loran-C and similar radio-frequency signals caused by receiver location acceleration effects and other distortion effects simulating the same, that comprises, receiving the radio-frequency signals and producing data therefrom by sampling and tracking the cycles of the signals with a time-constant filter sufficiently fast to accommodate for the largest acceleration to be experienced by the receiver location to avoid cycle slippage in locating a predetermined cycle zero crossing, and independently post-filtering a data output of said time-constant filter sufficiently slowly to smooth the data and without interaction with said sampling.

2. A method as claimed in claim 1 and in which said fast time-constant
is of the order of about one second.

3. A method as claimed in claim 1 and in which said radio-frequency signal receiving and filtering is independently effected for all of master and secondary Loran-C signals, and further comprising the step of weighting all sections of the sampled master and secondary Loran-C signals to estimate the phase velocity due to the receiver clock frequency offset on the basis of the strongest observed signal-to-noise ratio amongst the master and secondary Loran-C signals.

4. A method as claimed in claim 3 and in which said weighting is effected during clock signal tracking filtering.

5. Receiving apparatus for Loran-C and similar radio-frequency signals with elimination of possible cycle locking errors caused by the effects of receiver location acceleration and other distortion effects resembling the same, having, in combination, phase-lock-loop sampling and cycle tracking filter means for receiving said signals and producing data therefrom by sampling and tracking cycles of said signals with a time-constant adjusted sufficiently fast to accommodate for the largest acceleration to be experienced by the receiver location to avoid cycle slippage in locating a predetermined zero crossing, and post filter means having an input connected to a data output of the first-named filter means and of long time constant sufficiently slow to smooth the data and without interaction with the sampling of the first-named filter means.

6. Receiving apparatus as claimed in claim 5 and in which said fast time constant is of the order of about one second.

7. Receiving apparatus as claimed in claim 5 and in which said cycle tracking filter means is of the alpha, beta type.

8. Receiving apparatus as claimed in claim 5 and in which each of Loran-C master and secondary station signals is received in respective of said phase-lock-loop sampling and cycle tracking filter means, each connected to a respective one of said post filter means.

9. Receiving apparatus as claimed in claim 8 and in which clock-tracking filtering means is also provided, connected to receive the signals sampled from said master and secondary stations, and further provided with means for weighting the sampled signals to estimate the phase velocity due to the received clock frequency offset on the basis of the strongest observed signal-to-noise ratio amongst the master and secondary Loran-C signals.

10. Receiving apparatus as claimed in claim 9 and in which each of said sections of said phase-lock-loop sampling and cycle tracking filter means is connected to said clock-tracking filtering means to receive therefrom said estimate of the phase velocity.

11. Receiving apparatus as claimed in claim 8 and in which the signals from said master and secondary stations are applied to band limiting means before application to the respective sampling and cycle tracking filter means.

12. Receiving apparatus having, in combination, means for receiving radio-frequency signals from Loran-C and similar master and secondary stations, means for sampling the received signals, means for weighting all of the sampled signals to determine the strongest observed signal-to-noise ratio amongst the master and secondary Loran-C signals, and means for utilizing the signals with the strongest ratio for subsequent signal processing, said means for weighting being incorporated in clock signal tracking filter means utilizing to estimate the phase velocity due to the received clock frequency offset.

* * * * *